US007702292B2

(12) United States Patent
Philippe

(10) Patent No.: US 7,702,292 B2
(45) Date of Patent: Apr. 20, 2010

(54) JITTER REDUCTION CIRCUIT AND FREQUENCY SYNTHESIZER

(75) Inventor: Pascal Philippe, Caen (FR)

(73) Assignee: ST-Ericsson SA, Geneva (CH)

( * ) Notice: Subject to any disclaimer, the term of this patent is extended or adjusted under 35 U.S.C. 154(b) by 443 days.

(21) Appl. No.: 11/720,313

(22) PCT Filed: Nov. 10, 2005

(86) PCT No.: PCT/IB2005/053710

§ 371 (c)(1),
(2), (4) Date: May 25, 2007

(87) PCT Pub. No.: WO2006/056906

PCT Pub. Date: Jun. 1, 2006

(65) Prior Publication Data

US 2009/0224807 A1    Sep. 10, 2009

(30) Foreign Application Priority Data

Nov. 26, 2004   (EP) ................................. 04300817

(51) Int. Cl.
*H04B 1/40* (2006.01)
(52) U.S. Cl. ........................................ 455/76; 327/105
(58) Field of Classification Search ............... 455/76; 327/105, 165
See application file for complete search history.

(56) References Cited

U.S. PATENT DOCUMENTS 3,991,730 A * 11/1976 Crall ........................... 123/618
4,536,718 A * 8/1985 Underhill ...................... 331/16
5,070,254 A * 12/1991 Summers ..................... 327/105
5,668,504 A * 9/1997 Rodriques Ramalho ..... 331/1 A
6,417,707 B1 * 7/2002 Underhill et al. ............ 327/165

FOREIGN PATENT DOCUMENTS

| EP | 0 389 032 A1 | 9/1990 |
| EP | 0 753 941 A1 | 7/1995 |
| WO | 97/30516 A1 | 8/1997 |
| WO | 1997/30516 | 8/1997 |
| WO | 00/28666 A1 | 11/1998 |

OTHER PUBLICATIONS

"A Semidigital Dual Digital-Locked Loop", Stefanos Sidiropoulos, Mark A Horowitz; IEEE Journal of Solid-State Circuits, vol. 32 No. 11 Nov. 1997.

(Continued)

*Primary Examiner*—Matthew D Anderson
*Assistant Examiner*—David Bilodeau
(74) *Attorney, Agent, or Firm*—Michael C. Martensen; William J. Kubida; Hogan & Hartson LLP

(57) ABSTRACT

The jitter reduction circuit to reduce phase noise in a pulse train, comprises: —a resettable integrator (70) to integrate the pulse train, —a comparator (72) to compare the integrated pulse train with a reference level and to generate a modified pulse train with reduced phase noise, —a crossing time interval detector (94) configured to determine a discrete time interval during which the integrated pulse train crosses the reference level and to reset the integrator between two discrete time intervals determined consecutively.

10 Claims, 5 Drawing Sheets

OTHER PUBLICATIONS

"CMOS DLL-Based 2-V 3.2-PS Jitter 1-GHZ Clock Synthesizer and Temperature-Compensated Tunable Oscillator" David J Foley, Michael P Flynn; IEEE Journal of Solid-State Circuits, vol. 36 No. 3 Mar. 2001.

Sidiropoulos S et al: "A Semidigital Dual Delay-Locked Loop" IEEE Journal of Solid-State Circuits, IEEE Service Center, Piscataway, NJ, US, vol. 32, No. 11, Nov. 1997, pp. 1683-1692, XP000752878 ISSN: 0018-9200.

International Search Report, PCT/IB2005/053710, mailing date Nov. 7, 2006, pp. 3.

\* cited by examiner

JITTER REDUCTION CIRCUIT AND FREQUENCY SYNTHESIZER

FIELD OF THE INVENTION

The present invention relates to jitter reduction and frequency synthesizers.

BACKGROUND OF THE INVENTION

The known jitter reduction circuit to reduce phase noise in a pulse train comprises:
  a resettable integrator to integrate the pulse train,
  a comparator to compare the integrated pulse train with a reference level and to generate a modified pulse train with reduced phase noise,
  An example of such a jitter reduction circuit is described in WO 97/30516 in the name of UNDERHILL, Michael et al.

A known jitter reduction circuit continuously integrates the pulse train to obtain an analog sawtooth signal. The integration process is not perfect because of the use of capacitors and other electronic analog components. For example, if in one cycle, a capacitor is first charged from a voltage $V_A$ to a voltage $V_B$ with a current $I_A$ and then discharged from voltage $V_B$ to $V_A$ with a current $-I_A$ to generate one tooth of the sawtooth signal, an integration error appears. In fact, the time necessary to charge the capacitor from voltage $V_A$ to voltage $V_B$ is not exactly the same as the one necessary to discharge the same capacitor from voltage $V_B$ to voltage $V_A$. The integration error is small for one cycle. However, in known jitter reduction circuits, the integration error is accumulated from one cycle to the next one so that the accumulated integration error grows more and more important. Thus, these jitter reduction circuits are unreliable.

SUMMARY OF THE INVENTION

Accordingly, it is an object of the invention to provide a more reliable jitter reduction circuit.

This invention provides a jitter reduction circuit comprising a crossing time interval detector configured to determine a discrete time interval during which the integrated pulse train crosses the reference level and to reset the integrator between two consecutive determined discrete time intervals.

The negative consequences due to the accumulation of the integration error are reduced in the above jitter reduction circuit because the integrator is reset between two discrete time intervals determined consecutively. In fact, resetting the integrator also resets the accumulated integration error, so that the integration errors accumulated on the previous cycles have no impact over the following cycles. This resetting of the integrator does not affect the performance of the jitter reduction circuit, because it only occurs at a time when the integrated pulse train does not cross the reference level.

The features of the dependent claims, among others, reduce the manufacturing cost of the jitter reduction circuit.

Moreover, the features of the circuit according to the invention, comprising a reader to read the average frequency of the modified pulse train, and the integrator adapted to use the read value to integrate the pulse train, require no calculation of the average frequency of the modified pulse train.

The invention also relates to a frequency synthesizer including a jitter reduction circuit which comprises:
  a resettable integrator (70) to integrate the pulse train,
  a comparator (72) to compare the integrated pulse train with a reference level and to generate a modified pulse train with reduced phase noise,
  a crossing time interval detector (94) configured to determine a discrete time interval during which the integrated pulse train crosses the reference level and to reset the integrator between two discrete time intervals determined consecutively.

The invention also relates to a method of operating the jitter reduction circuit which comprises:
  a resettable integrator (70) to integrate the pulse train,
  a comparator (72) to compare the integrated pulse train with a reference level and to generate a modified pulse train with reduced phase noise,
  a crossing time interval detector (94) configured to determine a discrete time interval during which the integrated pulse train crosses the reference level and to reset the integrator between two discrete time intervals determined consecutively.

These and other aspects of the invention will be apparent from the following description, drawings and claims.

DESCRIPTION OF PREFERRED EMBODIMENTS

Figure 1:
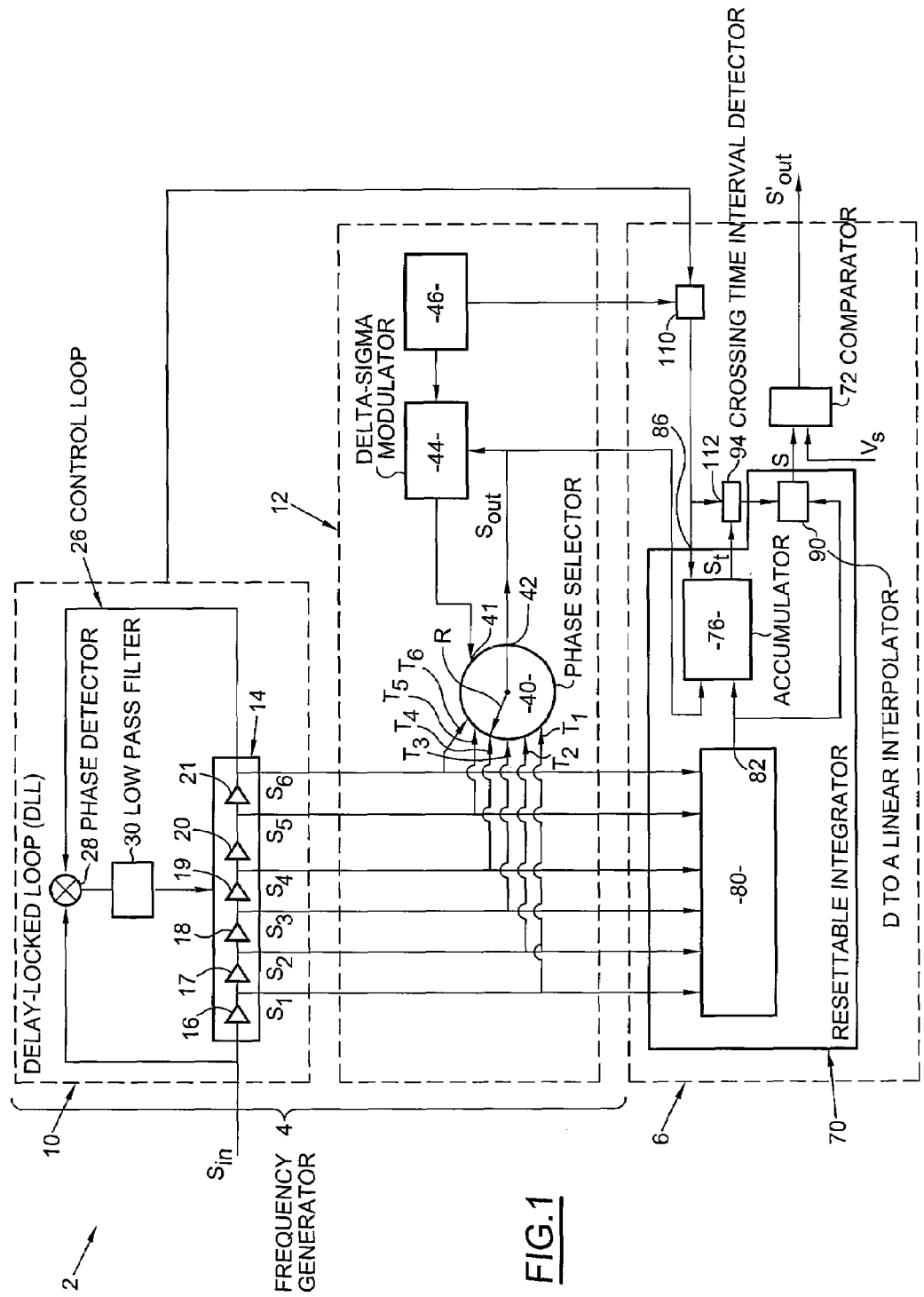
FIG. 1 is a schematic diagram of a frequency synthesizer including a jitter reduction circuit.

FIG. 1 shows a frequency synthesizer 2 having a frequency generator 4 connected to a jitter reduction circuit 6.

Frequency generator 4 generates a pulse train $S_{out}$, which is subject to phase noise. Phase noise is also called time jitter.

Generator 4 includes a delay-locked loop (DLL) 10 connected to a fractional multiplication circuit 12 to generate train $S_{out}$.

Delay-locked loop 10 generates N delayed pulse trains $S_i$ from an initial pulse train $S_{in}$. Each pulse train $S_i$ is delayed relative to a preceding pulse train $S_{i-1}$, by a time interval $T_e$. The time interval $T_e$ is chosen according to the following relation:

$$N*T_e = T_{in} \quad (1)$$

where:
  N is the number of delayed pulse trains $S_i$,
  $T_e$ is the time intervals separating two consecutive delayed pulse trains $S_i$,
  $T_{in}$ is the period of pulse train $S_{in}$, and
  * corresponds to the multiplication sign.

For simplicity, only the elements of DLL 10 necessary to understand the invention are shown. For more details, one may refer to "A semidigital dual digital-locked loop", Stefanos Sidiropoulos and Mark A. Horowitz, IEEE Journal of Solid-State Circuits, Vol. 32, no. 11, November 1997.

For example, DLL 10 has a delay line 14 including tunable delay units. For simplicity, only six delay units 16 to 21 are shown. An input of delay unit 14 receives train $S_{in}$. Delay units 16 to 21 are series connected between the input and an output of delay line 14. Each output of a delay unit outputs a respective train $S_i$.

A control loop 26 is used to tune interval $T_e$ of each delay units used in delay line 14 to satisfy the relation (1). Control loop 26 connects the output of delay line 14 to an input of a phase detector 28 and the input of delay line 14 to another input of phase detector 28. An output of phase detector 28 is connected to an input of a low pass filter 30. An output of filter 30 is connected to a control port of delay line 14 to dynamically tune interval $T_e$ according to the phase difference between pulse $S_{in}$ and the output of delay line 14.

Multiplication circuit 12 is designed to multiply the frequency of the input pulse train $S_{in}$ by a fractional ratio according to the following relation:

$$F_{out}=[N/(N-K-F)]*F_{in} \quad (2)$$

where:
$F_{out}$ is the average frequency of the multiplied output pulse train $S_{out}$,
K is an integer number comprised within [0, N/2[,
F is a fractional number ranging between ]0, 1[,
N is the number of delay units used in delay line 14, and
* corresponds to the multiplication sign.

Multiplication circuit 12 has a phase selector 40 having tap connections $T_i$ connected to each output of the delay units of DLL 10. Each tap connection $T_i$ is connected to a respective output of a delay unit of DLL 10. For simplicity, only six tap connections $T_1$ to $T_6$ are represented. Phase selector 40 has a counterclockwise rotatable pointer R to select one tap connection $T_i$ at a time in response to a rotation command. Phase selector 40 has an input 41 to receive a rotation command and an output 42 to output the multiplied pulse train $S_{out}$.

Circuit 12 has a Delta-Sigma modulator 44 to generate a rotation command according to a control word stored in a memory 46. The control word includes the integer K and the fractional number F of relation (2).

Figure 2:
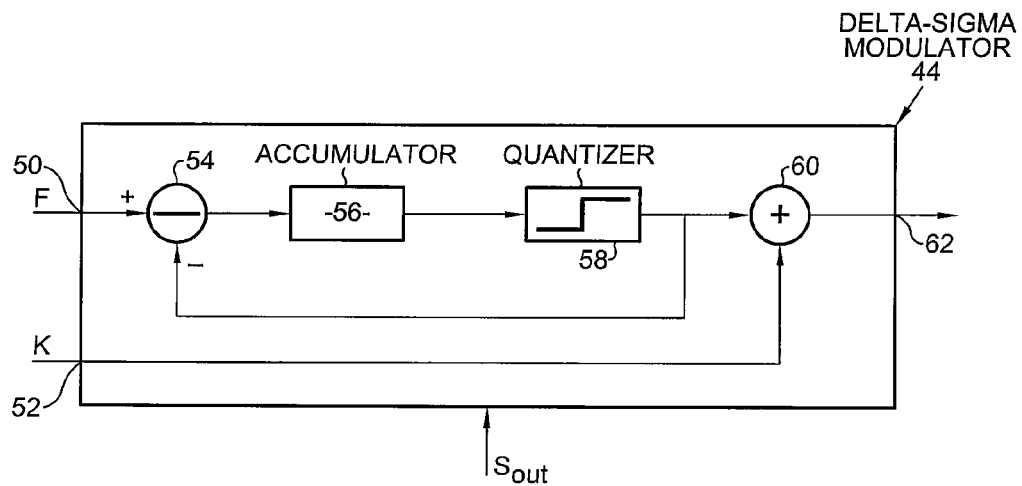
FIG. 2 is a schematic diagram of a Delta-Sigma modulator used in the circuit of FIG. 1.

Referring to FIG. 2, modulator 44 has an input 50 connected to memory 46 to receive fractional number F and an input 52 connected to memory 46 to receive integer number K. Modulator 44 is a first-order modulator. However, modulator 44 could be a higher-order modulator.

Input 50 is connected to a positive input of a substractor 54. An output of substractor 54 is connected to an input of an accumulator 56. Accumulator 56 accumulates the value transmitted by substractor 54 with the former value of the accumulator. An output of accumulator 56 is connected to an input of a quantizer 58. Quantizer 58 is tuned according to fractional number F. For example, if F=0.25, it outputs "0" if the input is lower than 0.5 and otherwise it outputs "1". The output of quantizer 58 is fed back to a negative input of substractor 54. The output of quantizer 58 is also connected to an input of an adder 60. Another input of adder 60 is connected to input 52. An output of adder 60 is connected to an output 62 of modulator 44, which is connected to the input 41 of phase selector 40. Modulator 44 is clocked by the falling edge of train $S_{out}$. Output 62 outputs either a rotation command to rotate pointer R by K or by K+1 at each falling edge of train $S_{out}$. The average rotation value resulting from the succession of these rotation commands converges to the value K+F.

Jitter reduction circuit 6 is designed to reduce the phase noise of train $S_{out}$.

Circuit 6 has an integrator 70 to integrate train $S_{out}$ and a comparator 72 to compare the output of circuit 6 with a reference level $V_S$ and to generate a modified pulse train $S'_{out}$ with reduced phase noise.

Integrator 70 builds a discontinuous sawtooth signal S, which is compared to the reference level $V_S$ by comparator 72.

Integrator 70 has an accumulator 76 to digitally integrate train $S_{out}$. Accumulator 76 increments the accumulated value by a value proportional to the average period $T_{out}$ of train $S_{out}$ at every falling edge of train $S_{out}$. Accumulator 76 has an input to receive train $S_{out}$. Average period $T_{out}$ is equal to N−K−F. Accumulator 76 also decrements the accumulated value by a predetermined value at every time interval $T_e$. For example, the predetermined value is equal to "1".

Integrator 70 includes a combiner 80 which has one output 82 to output a clock signal at a frequency of $F_{in}*N$. Output 82 is connected to a clock input of accumulator 76. Combiner 80 is designed to build the clock signal from the shifted phase signals $S_i$ generated by each output of delay units 16 to 21. For example, combiner 80 is built according to the teaching of FIGS. 9 and 10 of "CMOS DLL-Based 2-V 3.2-ps Jitter 1-GHz Clock Synthesizer and Temperature-Compensated Tunable Oscillator" (David J. Foley and Michael P. Flynn; IEEE Journal of Solid-State Circuits, Vol. 36, no. 3, March 2001).

Integrator 70 has an input 86 to receive the value N−K−F to be accumulated in accumulator 76.

Integrator 70 has also a digital-to-analog linear interpolator 90, adapted to be reset during the integration of train $S_{out}$.

Circuit 6 has a crossing time interval detector 94 to regularly reset integrator 70, and more precisely, to reset interpolator 90.

Figure 3:
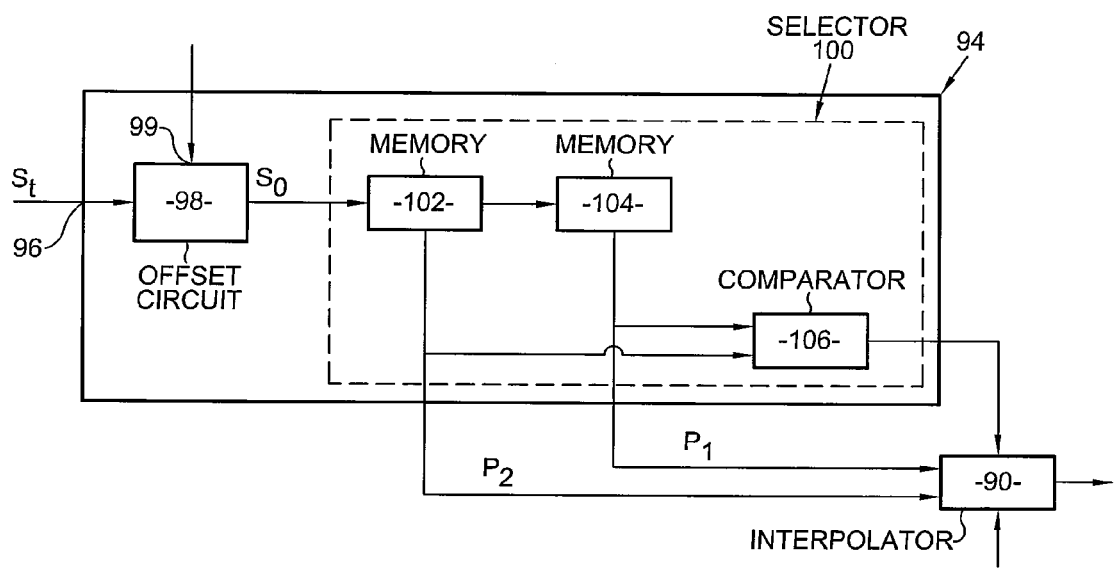
FIG. 3 is a schematic diagram of a crossing interval detector used in the circuit of FIG. 1.

Referring to FIG. 3, detector 94 has an input 96 to receive the digitally integrated pulse train $S_t$ generated by accumulator 76. Input 96 is connected to an input of an offset circuit 98 to transform signal $S_t$ to an offset signal $S_o$ oscillating around zero. Offset circuit 98 has an input 99 to receive the value N−K−F. Here, the offset value to transform signal $S_t$ to signal $S_o$ is (N−K−F)/2.

A selector 100 is implemented in detector 94 to select two points $P_1$ and $P_2$ which are just above and just under the zero level, respectively. Selector 100 includes two memories 102, 104 to store the current and the previous values of $S_o$ at the current time T and the previous time T−1 respectively. Selector 100 has a sign comparator 106 to compare the sign of the values stored in memories 102 and 104. If the value at time T is negative and the value at time T−1 is positive, then comparator 106 triggers a command to activate interpolator 90. Otherwise, comparator 106 generates no command and, in the absence of commands, interpolator 90 automatically remains in a resetting state.

FIG. 3 also shows that interpolator 90 has two inputs connected to memories 102 and 104 to receive the current and previous value of signal $S_0$ respectively. Interpolator 90 is clocked by combiner 80.

Circuit 6 (FIG. 1) has a control word reader 110 to read the integer value N used in DLL 10 and the integer K and fractional number F from the multiplication circuit.

Reader 110 is connected to input 86 of integrator 70 and to input 112 of offset circuit 94.

Figure 4:
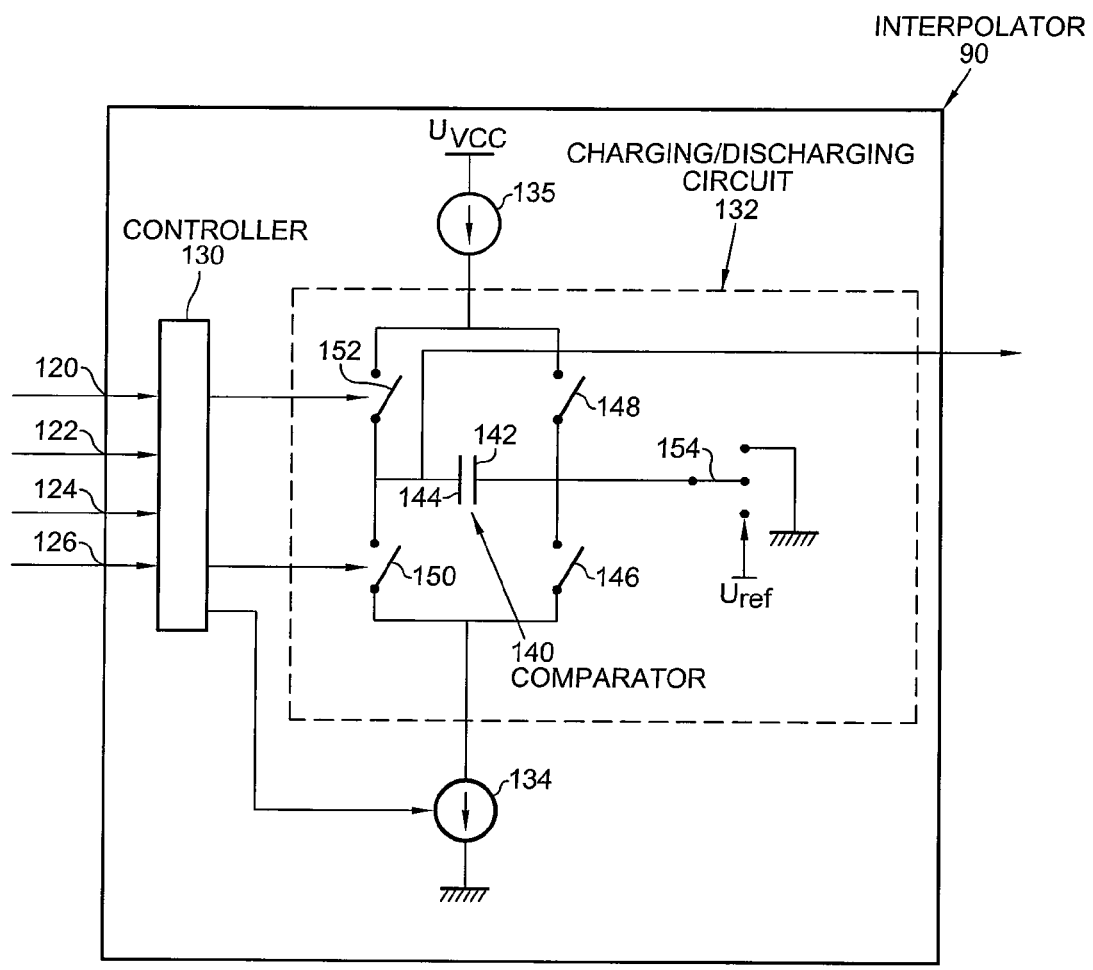
FIG. 4 is a schematic diagram of a digital-to-analog linear interpolator used in the circuit of FIG. 1.
Figure 5:
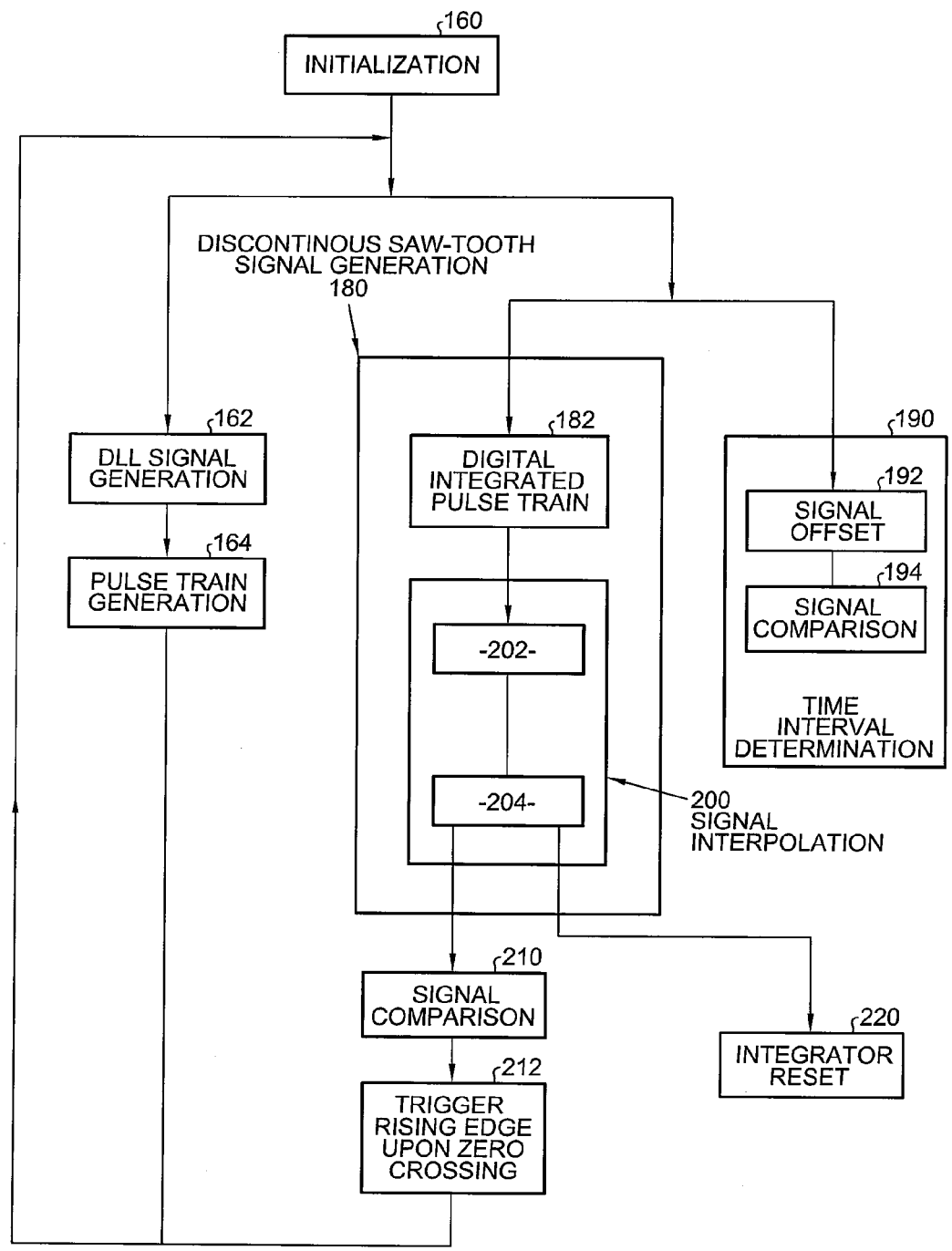
FIG. 5 is a flowchart of a method of reducing phase noise in an input pulse train.

Referring now to FIG. 4, interpolator 90 with a triangular impulse response is shown. Interpolator 90 has two inputs 120 and 122 to receive the current and previous value $P_2$, $P_1$ (FIG. 3) of signal $S_0$, respectively. Another input 124 receives the clock signal generated by combiner 80 and an input 126 receives the activation command generated by selector 100. These inputs are connected to a controller 130. Controller 130 commands a capacitor charging and discharging circuit 132 and two tunable current sources 134, 135.

Circuit 132 has a capacitor 140 with two facing plates 142 and 144. Plate 142 is connected to current source 134 through a switch 146 and to current source 135 through a switch 148. Plate 144 is connected to current source 134 through a switch 150 and to current source 135 through a switch 152. Switches 146 to 152 are controllable under the control of controller 130.

An output of current source 134 is connected to ground and an input of current source 135 is connected to a voltage source $U_{vcc}$.

Circuit 132 also has an interrupter 154 to connect plate 142 either to ground or to a reference voltage $U_{ref}$ under the control of controller 130.

The value of the current generated by sources 134, 135 is controlled by controller 130.

The operation of synthesizer 2 will now be described with reference to FIGS. 5 to 8.

At the initialization in step 160, the desired average period for pulse train $S_{out}$ is set. For example, the values of integer K and number F are saved in memory 46.

Figure 6:
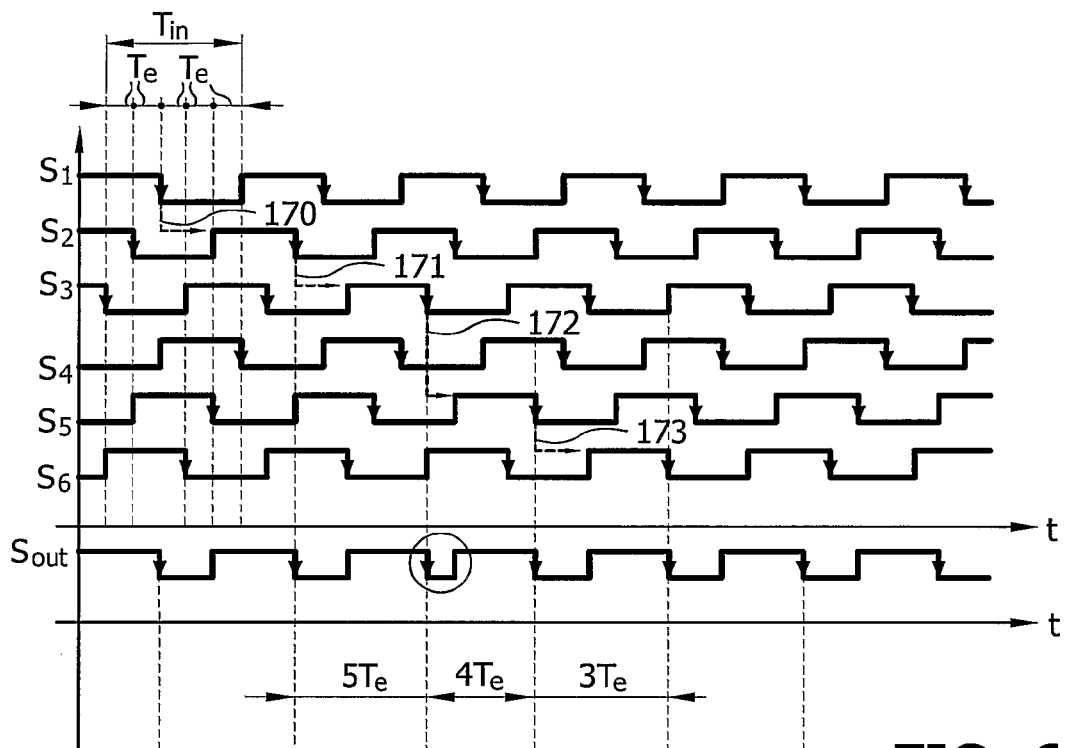
FIGS. 6 and 7 are timing diagrams of different signals appearing in the circuit of FIG. 1.

During the operation of generator 4 (FIG. 1) in step 162, DLL 10 generates signals $S_1$ to $S_6$. These signals $S_1$ to $S_6$ are shown in FIG. 6 according to time "t". On this figure period, $T_{in}$ and period $T_e$ are shown.

In step 164, multiplication circuit 12 multiplies one pulse train with a frequency of $[N/(N-K)]*F_{in}$ by one pulse train with a frequency of $[N/(N-K-1)]*F_{in}$ to generate a pulse train with an average frequency of $N/(N-K-F)*F_{in}$.

More precisely, pointer R of selector 40 is rotated by an amount of K tap connections upon the occurrence of a falling edge of the currently selected signal $S_i$ to generate a pulse of a train having a frequency of $[N/(N-K)]*F_{in}$. Similarly, pointer R is rotated by an amount of K+1 tap connections upon the occurrence of a falling edge of the currently selected signal $S_i$ to generate a pulse of a train with a frequency of $[N(N-K-1)]*F_{in}$.

Therefore, by multiplying rotations by K and K+1, the average frequency of pulse train $S_{out}$ is set to $[N(N-K-F)]*F_{in}$, where the fractional number F determines the way to multiply rotations by K and K+1.

To serve as an example, the multiplication process is illustrated in FIG. 6 with K=1 and F=0.25. As illustrated by the dotted arrow 170, upon the falling edge of signal $S_1$, pointer R is rotated by one and phase selector 40 selects signal $S_2$. Upon the next falling edge of signal $S_2$, pointer R is rotated by 1 and phase selector 40 selects signal $S_3$, as illustrated by dotted arrow 171. Upon the next falling edge of signal $S_3$, pointer R is rotated by two and phase selector 40 selects signal $S_5$, as illustrated by arrow 172. Upon the next falling edge of signal $S_5$, pointer R is rotated by one and phase selector 40 selects signal $S_6$, as illustrated by arrow 173. Upon the next falling edge of signal $S_6$, pointer R is rotated by one and phase selector 40 selects signal $S_1$. This selection process is continuously repeated while generator 4 is working. In this example the signal $S_4$ is ignored.

The corresponding pulse train $S_{out}$ generated by such a sequence of rotation commands is shown at the bottom of FIG. 6. The time interval between two falling edges of train $S_{out}$ is equal to $5*T_e$ when pointer R rotates by 1 and to $4*T_e$ when pointer R rotates by 2. This modification of the time interval between two consecutive falling edges of train $S_{out}$ is considered a phase noise that should be reduced by circuit 6.

Figure 7:
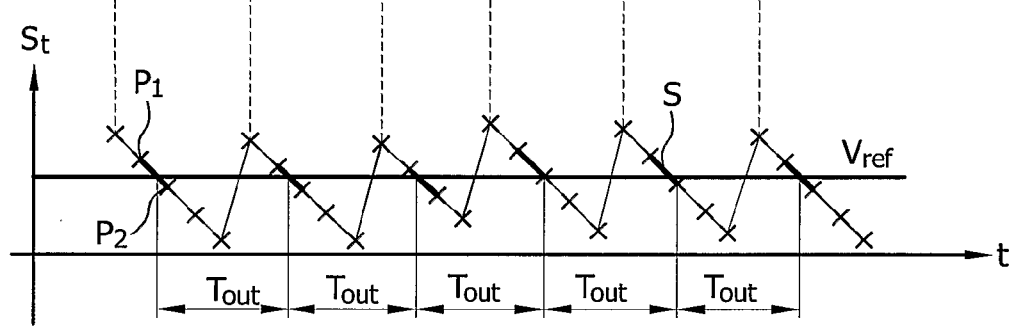

In parallel, in phase 180, integrator 70 integrates train $S_{out}$ to build the discontinuous sawtooth signal S. More precisely, in step 182, accumulator 70 builds the digital integrated pulse train $S_t$. Train $S_t$ has an average value that converges to a constant. For example, accumulator 76 increments the accumulated value by N-K-F at each falling edge of train $S_{out}$ and decrements the accumulated value by one at every time interval $T_e$. The accumulated value is output at every time interval $T_e$. The resulting signal $S_t$ is illustrated in FIG. 7 in the particular case where N=6, K=1 and F=0.25. The crosses represent the discrete points forming signal $S_t$.

Referring to FIG. 7, upon the first falling edge of signal $S_{out}$, the accumulated value is incremented by 4.75. After the first time interval $T_e$, the accumulated value is decremented to 3.75. After the second and third time intervals $T_e$, the accumulated value is decremented to 2.75 and 1.75 respectively. At the end of the fourth time interval $T_e$, the accumulated value is decremented to 0.75. Then, during the next time interval $T_e$, the accumulated value is both incremented by 4.75 and decremented by 1, so that the resulting accumulated value is equal to 4.5.

As seen in FIG. 7, the displacement of the falling edge of train $S_{out}$ in the time region, which is circled in FIG. 6, does not change the falling slope of sawtooth signal $S_t$. Therefore, the crossing points between the falling slopes of signal $S_t$ and reference level $V_{ref}$ are regularly spaced apart by a time interval which is exactly equal to period $T_{out}$.

In parallel to the building of signal $S_t$, in a step 190, detector 94 determines a discrete time interval during which the integrated pulse train crosses reference level $V_{ref}$.

First, in operation 192 detector 94 offsets signal $S_t$ by an amount equal to the value of the reference level. Here, offset circuit 98 offsets signal $S_t$ by a value equal to (N-K-F)/2. Then, during operation 194, selector 100 selects two points of signal $S_o$ which are just above and just below zero. During operation 194, comparator 106 compares the signs of the values saved in memories 102 and 104. If the value saved in memory 102 is negative and the value saved in memory 104 is positive, comparator 106 triggers the activation of interpolator 90. Otherwise, no activation command is sent to interpolator 90 and interpolator 90 remains in the resetting state.

FIG. 7 shows two points $P_1$ and $P_2$, which are selected by selector 100. These points $P_1$ and $P_2$ correspond to a discrete time interval during which signal $S_t$ crosses reference level $V_{ref}$.

In step 200 (FIG. 5), when interpolator 90 is activated, interpolator 90 linearly interpolates signal $S_t$ between the two selected points $P_1$ and $P_2$ to output this linear interpolation as an analog signal.

Figure 8:
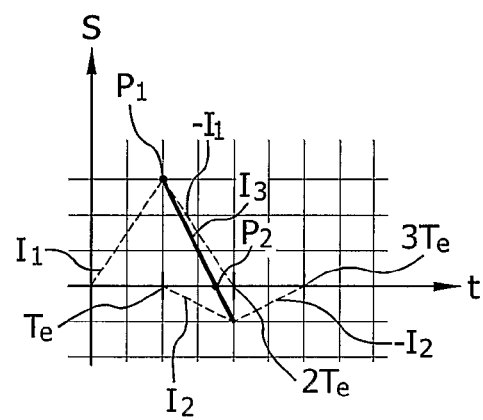
FIG. 8 is a draft illustrating a linear interpolation of the interpolator of FIG. 4.

Referring to FIG. 8, in step 202 (FIG. 5), controller 130 charges capacitor 140 with a positive current $I_1$, during a first time interval $T_e$. More precisely, during operation 202, switches 152 and 146 are closed and switches 148 and 150 are open and controller 130 tunes current source 134, so that the intensity of current $I_1$ is directly proportional to the value of point $P_1$. For example, the intensity of current $I_1$ is equal to the value of point $P_1$ here. Therefore, during the first time interval $T_e$, capacitor 140 is charged and at the end of the first time interval $T_e$, the voltage outputted by interpolator 90 is directly proportional to the value of point $P_1$. At the end of the first time interval, switches 146 and 152 are open and switches 148 and 150 are closed. Controller 130 also tunes current source 134 to obtain a discharging current $I_3$. The intensity of current $I_3$ is set during the step 204 according to the following relation:

$$I_3 = I_2 - I_1 \quad (3)$$

where:

"$I_1$" is the intensity of current $I_1$ which is diminished till 2Te, and

"$I_2$" is the intensity of current $I_2$, which is directly proportional to the value of point $P_2$ and which is increased to 3Te.

The proportionality between the intensity of currents $I_1$ and $I_2$ and the value of points $P_1$ and $P_2$, respectively, should be the same. Thus, here, the intensity of current $I_2$ is equal to the value of point $P_2$.

During the second time interval of $T_e$, capacitor 140 is discharged from a voltage value, which is proportional to the value of point $P_1$ to a voltage value, which is proportional to the value of point $P_2$. The analog falling slope of signal S is illustrated in FIG. 7 in bold lines.

In step 210, comparator 72 compares signal S to zero. In step 212 comparator 72 triggers a rising edge each time the signal S crosses zero. Therefore, comparator 72 builds an output pulse train $S'_{out}$, which has a frequency of $F_{out}$ and a reduced phase noise compared with the phase noise of $S_{out}$.

In step 220, at the end of interpolation step 200, integrator 70 is automatically switched to a resetting state 220. More precisely, in state 220, capacitor 140 is fully discharged. For example, controller 130 opens switches 148 and 152, closes switches 146 and 150 and switches interrupter 154 to connect both plates 142 and 144 of capacitor 140 to ground. During the resetting state, current source 134 is disabled.

Circuit 6 does not accumulate an integration error from one cycle to the other, because integrator 70 is reset during each cycle. For the same reason, it is not necessary for the pulses of train $S_{out}$ to have the same length as required with the device described in WO 97/30516.

Furthermore, circuit 6 is faster than the circuit in WO 97/30516, because the average period value of the pulse train $S_{out}$ is directly read from the frequency generator and is not calculated.

Many additional embodiments are possible. For example, generator 4 can be replaced with a generator using direct digital synthesis instead of a digital locked loop. The values of "1" and "N−K−F" used to generate a digital integrated pulse train are only given for the purpose of illustration. Other values may be chosen provided that the average value of the digital integrated pulse train converges to a constant value.

In another embodiment, offset circuit 98 may be cancelled. In this other embodiment, comparator 106 should be adapted to determine a value above and a value below the reference level $V_S$. In this embodiment, the reference level $V_{ref}$ used by comparator 72 is not equal to zero.

The function of digital-to-analog linear interpolator 90 can be realised with other circuit structures. For example, interpolator 90 can be replaced by a phase interpolator. A phase interpolator directly generates a rising edge at the time when signal S crosses reference voltage $V_s$, so in this embodiment comparator 72 is cancelled.

The invention claimed is:

1. Jitter reduction circuit to reduce phase noise in a pulse train, the circuit comprising: a resettable integrator to integrate the pulse train, a comparator to compare the integrated pulse train with a reference level and to generate a modified pulse train with reduced phase noise, a crossing time interval detector configured to determine a discrete time interval during which the integrated pulse train crosses the reference level and to reset the integrator between two discrete time intervals determined consecutively, wherein the crossing time interval detector comprises a selector adapted to select in each slope of the digital integrated pulse train a point above the reference level and a point below the reference level, these points corresponding to the boundaries of the discrete time interval.

2. The circuit according to claim 1, wherein the integrator comprises an accumulator adapted to build a digital integrated pulse train made from a succession of discrete points, the digital integrated pulse train comprising a shape of a sawtooth signal with slopes.

3. The circuit according to claim 2, wherein the integrator comprises a digital-to-analog linear interpolator to linearly interpolate the digital integrated pulse train between the two selected points and to output the result of the linear interpolation as an analog signal.

4. The circuit according to claim 3, wherein the linear interpolator has a triangular impulse response.

5. The circuit according to claim 3, wherein the interpolator comprises a capacitor and a tunable current source to charge or discharge the capacitor with a current having a value proportional to the difference between the selected points.

6. The circuit according to claim 5, wherein the interpolator comprises switches to connect the capacitor to a reference voltage to reset the interpolator.

7. The circuit according to claim 1, wherein the circuit comprises a reader to read the average frequency of the modified pulse train, and the integrator adapted to use the read value to integrate the pulse train.

8. A frequency synthesizer comprising:
a frequency generator comprising a control word to fix the average frequency of the generated pulse train, and
a jitter reduction circuit according to claim 1 for reducing the phase noise of the generated pulse train, wherein the jitter reduction circuit is adapted to read the control word and to use the control word to integrate the generated pulse train.

9. The synthesizer according to claim 8, wherein the frequency generator comprises a delay-locked loop having a plurality of delay units to shift the phase of an initial pulse train, each delay unit having an output and wherein the jitter reduction circuit comprises a combiner connected to each of the outputs of the delay units to generate a clock signal at a frequency N times higher than the frequency of the initial pulse train to clock the accumulator of the jitter reduction circuit, N being an integer strictly greater than one.

10. A method of operating a jitter reduction circuit to reduce phase noise in a pulse train, the method comprising: resetting an integrator to integrate the pulse train, comparing with a comparator, the integrated pulse train with a reference level and to generate a modified pulse train with reduced phase noise, detecting with a crossing time interval detector, configured to determine a discrete time interval during which the integrated pulse train crosses the reference level and to reset the integrator between two discrete time intervals determined consecutively, and wherein detecting with the crossing time interval detector comprises selecting with a selector adapted to select in each slope of the digital integrated pulse train a point above the reference level and a point below the reference level, these points corresponding to the boundaries of the discrete time interval.

* * * * *